United States Patent [19]

Jain et al.

[11] Patent Number: 5,107,152

[45] Date of Patent: Apr. 21, 1992

[54] CONTROL COMPONENT FOR A THREE-ELECTRODE DEVICE

[75] Inventors: Nitin Jain; Ronald J. Gutmann, both of Troy, N.Y.; David Fryklund, Hampton Falls, N.H.

[73] Assignee: MIA-COM, Inc., Burlington, Mass.

[21] Appl. No.: 404,651

[22] Filed: Sep. 8, 1989

[51] Int. Cl.$^5$ .......................................... H03K 17/687
[52] U.S. Cl. ................................... 307/571; 307/253; 333/262
[58] Field of Search ................ 333/262, 103; 307/450, 307/571, 253, 572

[56] References Cited

U.S. PATENT DOCUMENTS

| | | | |
|---|---|---|---|
| 3,325,654 | 6/1967 | Mrazek | 307/571 |
| 3,412,266 | 11/1968 | Tarico | 307/571 |
| 3,495,097 | 2/1970 | Abramson et al. | 307/571 |
| 3,559,109 | 1/1971 | Matsushige et al. | 333/262 |
| 3,560,726 | 2/1971 | Platt | 307/572 |
| 3,731,116 | 5/1973 | Hill | 307/572 |
| 4,020,365 | 4/1977 | Weir | 307/571 |
| 4,303,831 | 12/1981 | El Hamamsy | 307/571 |
| 4,438,351 | 3/1984 | Schuermeyer | 307/272.2 |
| 4,642,584 | 2/1987 | Funck et al. | 333/262 |
| 4,701,646 | 10/1987 | Richardson | 307/450 |
| 4,798,979 | 1/1989 | Lee et al. | 307/450 |

OTHER PUBLICATIONS

Horowitz and Hill, "The Art of Electronics", Cambridge U. Press, 1980, p. 381.
Fisk and Christiansen, "Electronics Engineers' Handbook", McGraw-Hill Book Co., 1982, pp. 7-40-76-41.
G. E. Intersil, "Quad Varafet Analog Switch", 1987, pp. 8-59-8-63.

Primary Examiner—Stanley D. Miller
Assistant Examiner—Toan Tran
Attorney, Agent, or Firm—Wolf, Greenfield & Sacks

[57] ABSTRACT

A gate biasing circuit including a Schottky barrier diode in series with an ion implanted resistor for use with a baseband MMIC control components such as an MESFET. The diode gate biasing scheme improves the low frequency distortion characteristics of GaAs MESFET control components significantly, allowing microwave power handling and distortion characteristics to be maintained below 100 Hz.

19 Claims, 3 Drawing Sheets

C1 AND C2 ARE CONTROL SIGNALS

| CASE | BIAS HIGH/LOW | FREQUENCY | | |
|---|---|---|---|---|
| | | .01 MHz | 30 MHz | 100 MHz |
| 1 | 0/-7 | 22 dBm | 28 dBm | 32 dBm |
| 2 | +10/-7 | >34 dBm | >34 dBm | >34 dBm |

INCIDENT POWER FOR 1dB COMPRESSION
CASE 1 (CONVENTIONAL GATE BIAS CIRCUIT) AND
CASE 2 (DIODE-GATE BIAS CIRCUIT)

HARMONIC DISTORTION VERSUS FREQUENCY FOR D₂T COMPONENT
WITH (a) CONVENTIONAL GATE BIAS CIRCUIT AT 0/-7V
(b) DIODE-GATE BIAS CIRCUIT AT +8/-10V (a)

(b)

CONTROL COMPONENT FOR A THREE-ELECTRODE DEVICE

BACKGROUND OF THE INVENTION

1. Field of the Invention

The present invention relates in general to a transistor control component and, in particular, a gate biasing scheme for improving the low frequency distortion characteristics of the control component and the attendant power handling capabilities thereof. More particularly, the present invention relates to a low distortion MESFET control component particularly for baseband applications.

2. Background Discussion

In microwave integrated circuits, devices such as field effect transistors are very commonly used. For example, GaAs MESFETs are presently widely used in broadband control applications, functioning as, for example, switches and variable attenuators. Because the control port (gate) is isolated from the RF ports (source and drain), the MESFET consumes little prime power in either of its two operating states. In addition, MESFETs are capable of sub-nanosecond switching and the devices are compatible with conventional MMIC processing. Due to this, MESFETs are increasingly employed in baseband applications such as KHz to GHz sweep oscillators, high speed A/D converters, digital step attenuators and solid state relay replacements.

However, at low frequencies, MESFETs exhibit increased distortions and can handle about 10 dB less power than at higher frequencies. This phenomenon has been documented experimentally and confirmed by switches described in the following relatively recent articles; M. J. Schindler and A. Morris, "DC-40 GHz and 20–40 GHz MMIC SPDT Switches," IEEE Trans. Electron Devices ED-34, Dec. 1987, pp. 2595-2602; M. J. Schindler, M. E. Miller, and K. M. Simon, "DC-20 GHz N X M Passive Switches," IEEE Trans. Microwave Theory and Tech., MTT-36, Dec. 1988, pp. 1604-1613; and R. J. Gutmann, N. Jain, M. Schindler, M. Miller, and K. Simon, "Comments on GaAs MESFET Baseband-to-Microwave Passive Switches," IEEE Trans, Microwave Theory and Tech., MTT-37, July 1989, pp. 1154-1155.

Because these MESFET devices are becoming so widely used, there is a real need to improve the low frequency power handling characteristics of these devices. The low frequency power handling problems occur when the gate ceases to be strongly coupled to the RF path. This takes place at low frequencies when the capacitive reactance from the device-to-gate node is significantly increased and the regularly floating gate becomes AC grounded. Unsuccessful attempts have been made at curing these low frequency power handling problems.

One widely accepted attempt at curing the low frequency power handling problems includes gate bias circuitry which consists of a 2-5K ohm resistor at the gate port of the MESFET. The resistor somewhat improves distortion performance, however, these conventionally biased MESFETs still incur low frequency power handling problems. Further attempts have been made to improve low frequency power handling problems by increasing the value of the resistor tenfold from approximately 2-5K ohm to approximately 25-50K ohm. By increasing the resistance tenfold, the frequencies at which distortion performance is improved is reduced tenfold, however, switching speed is also increased tenfold. Thus, there is a trade-off between improved distortion performance and slower switching speeds.

The low frequency power-handling degradation of a conventionally biased control MESFET is due to reduced AC signal coupling to the gate. At high frequencies (above 100 MHz) the capacitive reactance of the active device-to-gate node is much lower than the gate biasing resistance so that the gate is floating. However, at low frequencies the capacitive reactance is much higher than the gate biasing resistance, and the gate becomes AC grounded thereby degrading the strong coupling path to the RF ports.

In the conducting state, reduced AC signal coupling to the gate at low frequencies results in early power saturation and gate current injection. At low frequencies, the channel voltage immediately below the gate in the channel fails to couple on to the gate. If the RF voltage is in the positive half-cycle the channel becomes more positive at the RF source end with respect to the gate. Thus, the channel begins to close. If the RF voltage is in the negative half-cycle, the gate becomes more positive with respect to the channel and forward current injection occurs. Neither situation is desirable.

In the non-conducting state, reduced AC signal coupling to the gate at low frequencies results in lower AC voltages at which the device comes out of pinch-off and goes into avalanche breakdown. When the voltage between source-gate or drain-gate falls below pinch-off, opening of the channel occurs during part of the RF cycle. At high frequencies, the gate voltage is between the source and drain voltages. If the source is grounded and the drain voltage swings by V volts, the gate will swing around the bias voltage by about V/2. Thus the gate-to-drain voltage will swing from $V_{bias}+V/2$ to $V_{bias}-V/2$. At low frequencies, the voltage fails to couple to the gate, and therefore the gate-to-drain voltage will swing from $V_{bias}+v$ to $V_{bias}-v$. This causes opening of the channel earlier than at high frequencies. Similarly junction breakdown occurs prematurely.

OBJECTS OF THE INVENTION

Accordingly, it is an object of the present invention to provide an improved microwave control component with enhanced power handling capability particularly at low frequencies.

It is a further object of the present invention to provide a control MESFET device with adequate power handling capability down to frequencies in the range below 100 Hz.

A further object of the present invention is to provide an improved gate biasing circuit for a microwave control component such as a MESFET so as to improve the distortion characteristics, particularly at low frequencies of operation. Degraded distortion and poor power handling capabilities are associated with the early current saturation and gate current injection which occurs at low frequencies during the conducting state of operation.

Still another object of the present invention is to provide an improved bias scheme for a transistor control component such as a MESFET and in which the biasing improves the power handling capabilities of the component. The power handling problems overcome are associated with the premature avalanche breakdown and opening of the channel which occurs at low frequencies during non-conducting state operation.

SUMMARY OF THE INVENTION

To accomplish the foregoing and other objects, features and advantages of the invention, there is provided a field effect transistor control component that includes a field effect transistor having source, drain and gate electrodes. Means are provided for establishing an RF signal that is to be coupled between the source and drain electrodes of the field effect transistor. A control voltage input terminal is provided for receiving a control voltage waveform for switching the transistor between conducting and non-conducting states. In accordance with the improvement of the present invention, biasing means are provided for enhancing low frequency power handling capabilities. This biasing means includes a resistance means, a diode means having high and low current conduction states, and means coupling the resistance means and the diode means in a series circuit between the input terminal and the gate electrode. The diode means is arranged polarity-wise so that the diode means is in its low current conduction state when the control voltage waveform causes the transistor to be in its conducting state.

In accordance with further aspects of the present invention and in connection with one embodiment thereof described herein, the gate bias circuitry may be comprised of a Schottky barrier diode and an associated biasing resistor. The aforementioned diode may be replaced by a monolithic diode or a diode that is part of an integrated circuit. The aforementioned resistor may typically be a resistor in a range of a few kohms or greater.

In accordance with further aspects and features of the present invention, in the non-conducting state of operation, a negative bias voltage is chosen close to the avalanche breakdown voltage to avoid opening of the channel. In the conducting state of operation, a bias voltage is chosen to be near the highest possible AC voltage in the channel to avoid premature saturation and gate current injection.

BRIEF DESCRIPTION OF THE DRAWINGS

Numerous other objects, features and advantages of the invention should now become apparent upon a reading of the following detailed description taken in conjunction with the accompanying drawing, in which.

DETAILED DESCRIPTION OF THE PREFERRED EMBODIMENT

Figure 1:
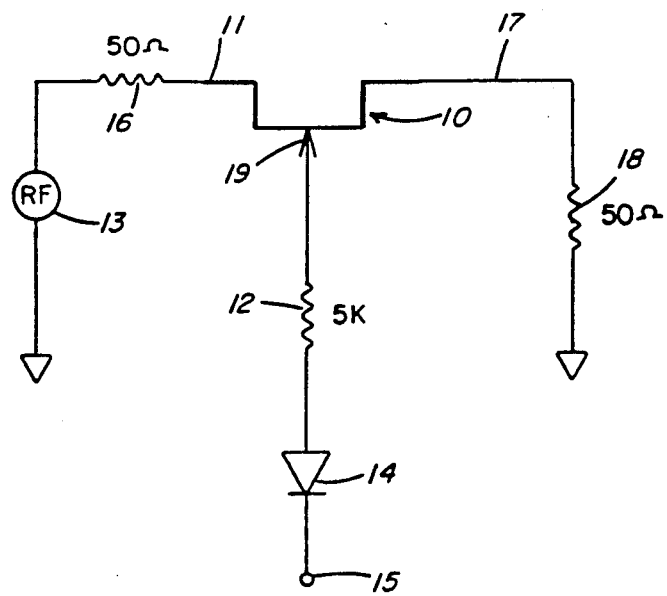
FIG. 1 is a circuit diagram illustrating the diode-gate MESFET biasing scheme.

Reference is now made to the drawings, and in particular, to FIG. 1 which illustrates a preferred embodiment for the present invention. FIG. 1 shows the circuit diagram for the diode-gate biasing scheme. The circuit includes the MESFET device transistor 10 with a 5k ohm resistor 12 connected in series with a Schottky barrier diode 14. The diode 14, as noted, has its anode coupled to resistor 12 and its cathode coupled to the control terminal 15. The control terminal 15 is adapted to have a control signal applied thereto which is positive in the conducting state and negative in the non-conducting state of the transistor.

The addition of the diode 14 to the conventional gate bias resistor 12, along with choosing the proper gate bias voltage, serve to alleviate the power handling problems caused by reduced AC signal coupling to the gate at low frequencies.

FIG. 1 also shows an illustration of the remaining circuitry in the event that the transistor is used as a switch. There is an input RF source 13 connected by way of resistor 16 to the source electrode 11 of the transistor 10. On the other side of the transistor, the drain electrode 17 is connected to a load resistor 18. Both resistors 16 and 18 are 50 ohm matching resistors. The gate electrode 19 of the transistor 10 connects to the biasing resistor 12.

In the conducting state, the addition of the diode 14 results in floating the gate and maintaining the gate voltage between source and drain voltages. The gate is effectively floated by reverse-biasing the diode 14 with a positive voltage, namely the control voltage applied at the terminal 15. This voltage is positive for the conducting state.

To maintain a positive control voltage, the bias voltage is chosen to be close to the highest possible AC voltage in the channel. This arrangement alleviates the problem of early current saturation and gate current injection previously referred to.

In the non-conducting state, the negative bias voltage at terminal 15 is chosen to be close to the avalanche breakdown voltage to avoid opening of the channel. In addition, the avalanche breakdown produces comparatively little distortions with the presence of the gate bias resistor 12. The negative bias voltage is transmitted through the diode 14 and the device behaves with little distortion.

The diode 14, which is preferably a Schottky diode, is selected to have certain particular parameters. First, the capacitive reactance of the diode in the off-state is to be higher than the MESFET gate-channel coupling capacitive reactance in the conducting state. This is due to the fact that low frequency distortions result when gate biasing impedances are lower than capacitive reactances of the active device-to-gate node. Thus, the Schottky diode in its off-state has to have lower capacitance than that of the MESFET gate-capacitance in the conducting state. For example, for a 1.2 mm FET, conducting state FET gate-to-channel capacitance is about 1.3 pF. The off-state diode capacitance, therefore, should be less than 1.3 pF. An off-state diode with 0.1 pF or less is appropriate.

The second parameter relating to the diode is that the diode has sufficient current capacity. The diode is to be large enough to allow the required current to switch the device, and handle any avalanche breakdown current which is low because of the large gate bias resistance. Thus, the diode should be as small in current level as allowed by the current swings in the gate bias circuitry to switch the MESFET.

The gate biasing diode does not affect the other characteristics of the MESFET significantly. Switching speed of the MESFET can be maintained by designing or biasing the diode appropriately. To maintain the switch speed either (1) the diode area must be approximately equal to or slightly less than that of the MESFET gate area or (2) the bias must be increased to the point where the required switching speed is attained or (3) both. The insertion loss shows some improvement at low frequencies because the MESFET gate is more effectively floated. The physical size of the Schottky diode is relatively small and is easily implemented monolithically. Although a Schottky diode is preferred, any diode having the above-discussed characteristics is sufficient. For instance, a diode-coupled transistor meeting the criteria set forth above would be acceptable. The only negative aspect in MMIC implementations is the requirement of a positive supply voltage, rather than zero, in the conducting state of the MESFET. In this connection, and as set forth hereinafter in the claims, the term "diode means" is meant to cover any equivalents thereof having the characteristic of opposite high and low impedance states.

In accordance with the above features and descriptions of the present invention, the diode-gate biasing scheme was embodied in a dual two-throw control component circuit and tested for power handling capabilities. The test and results are described below.

Figure 2:
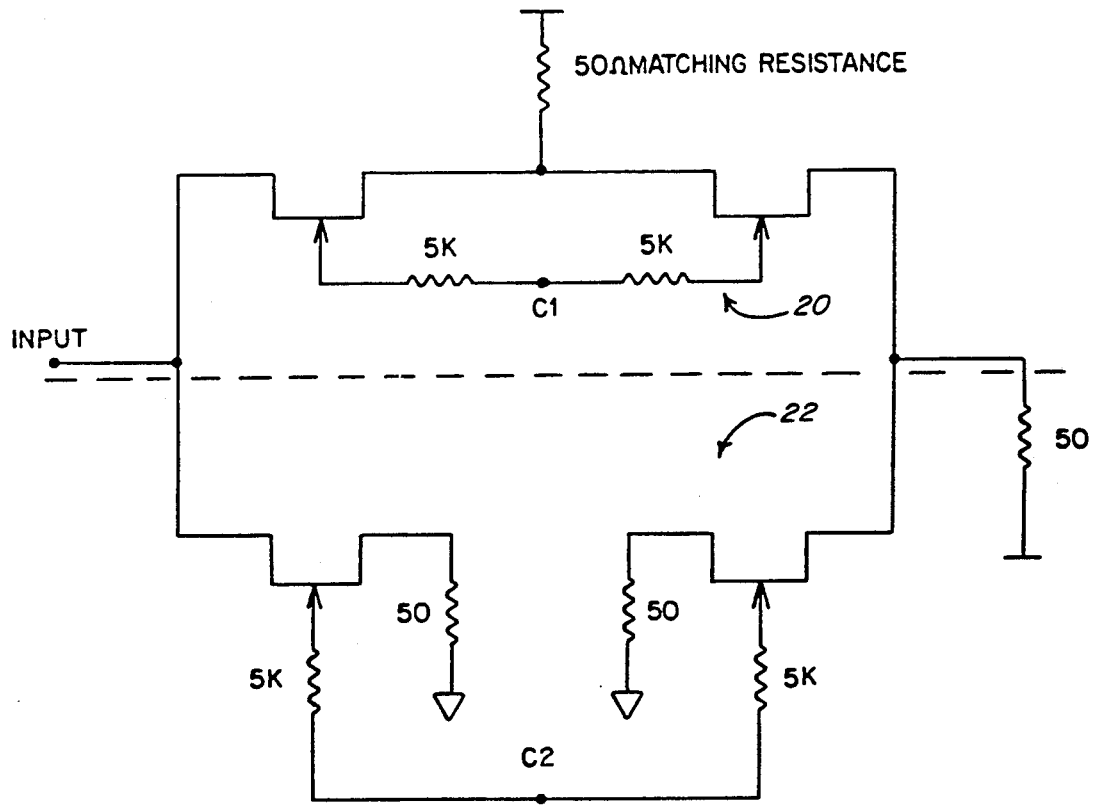
FIG. 2 is a circuit diagram of a dual two-throw control component tested for power handling improvement.

In order to improve the power handling capability of these switches, as in accordance with the present invention, the on-state of the FET is biased more positive than the most positive channel RF signal. This condition is to be maintained over the frequency range. Because the switch shown in FIG. 2 is a broadband switch, a feedback of the RF signal is applied in such a manner that it is present over the broad frequency range. As noted before, by essentially floating the gate with the diode scheme of the present invention, such behavior can be achieved.

There are stray capacitances from the gate lead connection at the component fixtures to ground and these capacitances can be large enough such that the signal coupled to the gate may be significantly reduced. Therefore, in accordance with the invention, the MESFET is isolated without the stray capacitance. It is isolated by floating the gate by means of a reverse-biased diode from a positive control supply. Again, refer to FIG. 1 herein.

With this diode bias technique, the gate is effectively floated and thus the signal gets coupled to the gate. Since even a reverse-biased diode has capacitance, the biasing resistor is essentially grounded through a capacitance. As indicated previously, so that the biasing is carried out properly, the capacitance of the diode has to be less than both the gate-drain and gate-source capacitances. Also, as indicated previously, a capacitance in the order of 1/10th or less of the gate-channel capacitance in the conducting state is the desired off-state diode capacitance.

The size of the diode cannot be arbitrarily small as it has to have sufficient charge to switch the MESFET and to allow a certain DC bias current in the off-state. Typically, 1-2 milliamps of current in the off-state is a conservative estimate. In practice, 100-200 microamps represents a typical value. A diode that is within this specification can be easily made.

As indicated previously, the circuit of FIG. 2 has been used as a test circuit. FIG. 2 actually shows the configuration of the switch using a previous biasing technique of only a single resistor at the gate.

In the test, conventionally-biased MESFETs were employed in a dual two-throw control component circuit as shown in FIG. 2 and tested for power handling capabilities. Next, the conventionally biased MESFETs were replaced by MESFETs employing the diode-gate biasing scheme of the present invention, and the test was repeated.

The dual two-throw is schematically shown in FIG. 2, where the AC signal is either directed through the upper branch 20, by pinching off the lower branch 22 MESFETs in the loss state, or through the lower branch 22, by pinching off the upper branch 20 MESFETs in the isolation state. The MESFETs used in the dual two-throw component are standard power FETs, which have a channel doping of $8 \times 10^{16} CM^{-3}$, pinch-off voltage of about 3.4 V, gate periphery of 1.2 mm and $I_{DSS}$ of approximately 210 mA/mm.

Figures 3, 4:
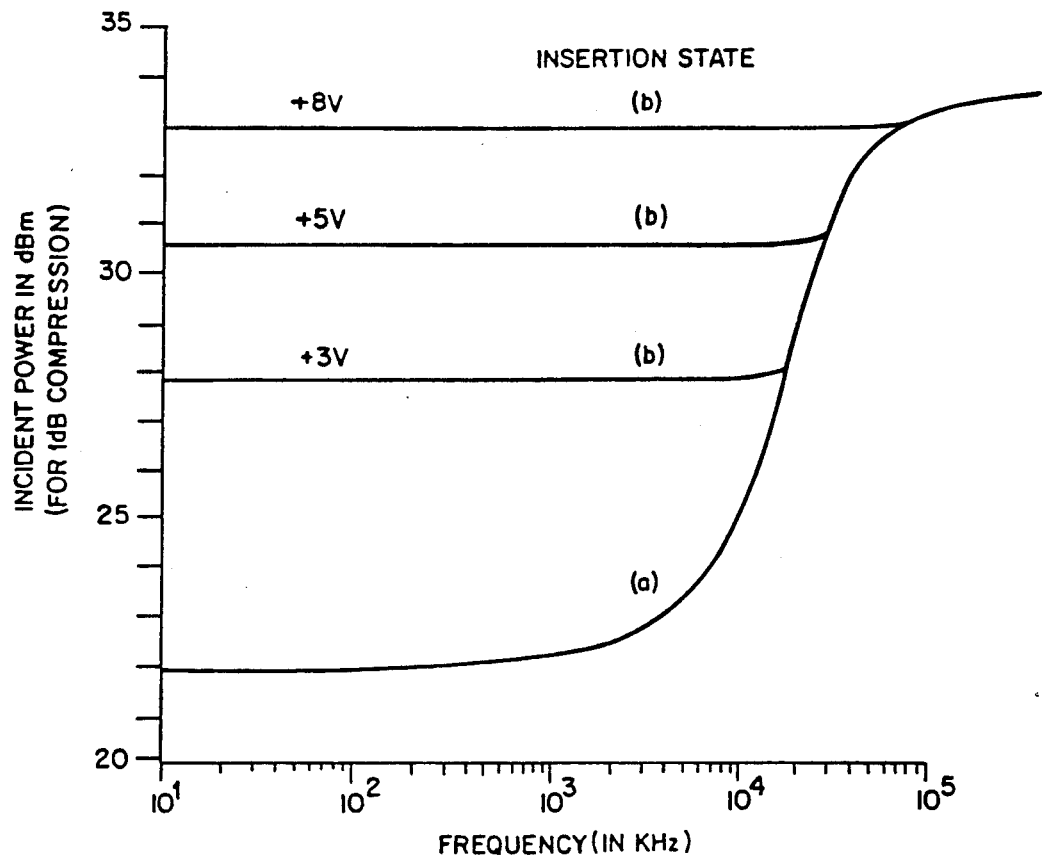
FIG. 3 is a plot showing the measured power handling capability of the dual two-throw control component with (a) the role conventional 5K ohm gate resistance and (b) the diode-gate biasing circuit of the invention.
FIG. 4 is a table showing the incident power for 1 dB compression for both a conventional circuit and a diode-gate bias circuit.

To examine the conducting state MESFETs, the MESFETs in the lower branch were removed, and the MESFETs were biased initially in a conventional manner. Plot (a) in FIG. 3 shows the typical power handling capability (measured by the 1 dB compression point) of the two MESFETs in series, versus frequency. The 1 dB compression point is defined as the input power at which the output power becomes 1 dB different from linear behavior. As shown in FIG. 3 plot (a), the power handling capability decreases from about 33 dBm at frequencies above 100 MHz to about 22 dBm at frequencies below 1 MHz.

The series MESFETs were then modified by external bonding to the MESFET, the gate-diode biasing scheme as shown in FIG. 1. The power handling capability was remeasured with varying positive gate biases. The typical 1 dB compression point of bias voltage shown in FIG. 3, plot (b), indicates that the low frequency power capability can be maintained at the microwave level with sufficient positive bias. Spot measurements were taken at as low as 100 Hz with little change in the 1 dB compression level.

Thus, as indicated in FIG. 3, there is a clear improvement in the power handling capability with the diode and resistor biasing scheme of the present invention. It is to be noted that the bias voltage at the control lead that is floating is preferably more than the most positive voltage of the RF signal in the channel. Thus, and as indicated in FIG. 3, increasing the positive bias improves the power handling capability. FIG. 3 shows best results when the positive voltage is at 8 volts which is close to the maximum channel voltage that may be on the order of 10 volts.

The Schottky diode that has been used in the biasing of circuitry can be formed monolithically. Alternatively, a discrete diode can be used for gate biasing. Thus, the invention may be embodied either in discrete, hybrid or monolithic form.

FIG. 4 is a table showing the 1 dB compression points at .01, 30, and 100 MHZ for the two different biasing schemes. As shown, case 2 (diode-gate biasing scheme) can handle about 7 dB more power than case 1 (conventional biasing scheme) at 30 MHZ and about 13 dB more power at 10 KHZ.

Figure 5:
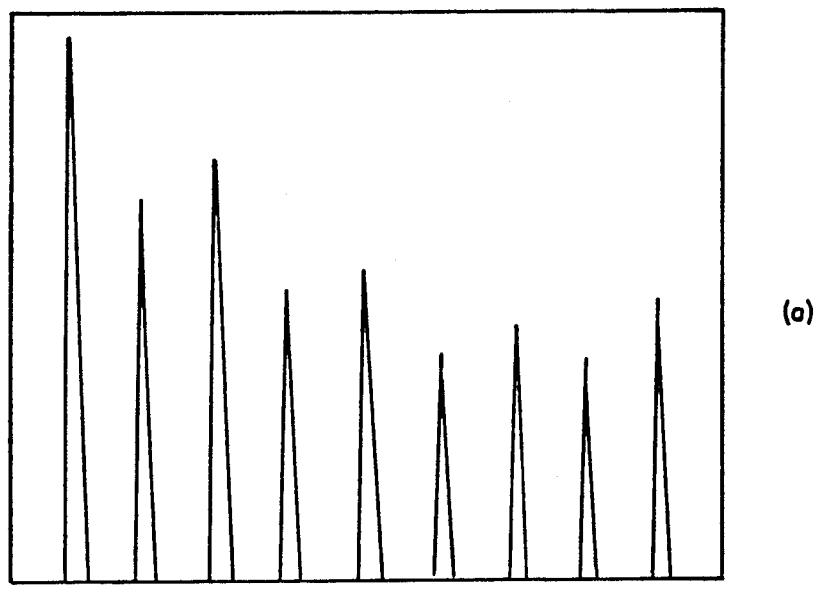
FIG. 5 is a graph illustrating the harmonic distortion versus frequency for the dual two-throw control component (a) with the conventional biasing circuit at 0/−7V and (b) with the diode-gate bias circuit at +8/−10V.
Figure 5:
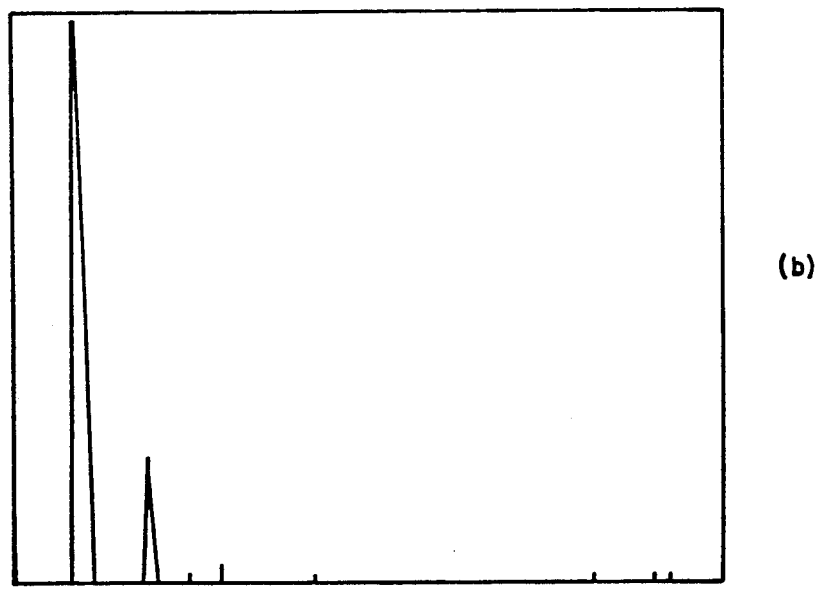

In addition to the significant improvement in 1 dB compression level at low frequencies, the total harmonic distortion (THD) is reduced appreciably. FIG. 5 indicates that the THD of a dual two-throw control component with 23 dBm incident power at 10 KHZ is reduced from −16 dBc to −65 dBc with the new diode-gate biasing scheme. Similar improvements are observed in other switch configurations where the non-linearities are dominated by the conducting state of MESFETs.

Having now described a limited number of embodiments of the present invention, it should now be apparent to those skilled in the art that numerous other embodiments and modifications thereof are contemplated as falling within the scope of the present invention as defined by the appended claims.

What is claimed is:

1. A control component for a three-electrode device having first and second signal electrodes and a control electrode, said three-electrode device having a channel between said first and second signal electrodes, said control component comprising:
   means establishing a periodic signal to be coupled between the first and second electrodes of the device,
   an input terminal for receiving a control voltage signal for switching said device between conducting and non-conduction states,
   a coupling capacitance inherent to said three-electrode device, said coupling capacitance coupling said channel to said control electrode;
   bias means for enhancing low frequency power handling and efficiency capabilities and including a resistance means and a diode means having high and low current conduction states, and means coupling the resistance means and diode means in a series circuit between said input terminal and said control electrode, said bias means enabling system operation with periodic signals including signals having frequencies greater than 20 MHz, said diode means arranged polarity-wise so that said diode means is in its low current conduction state when said control voltage signal causes said device to be in its conducting state, said diode means having a capacitive reactance in its low current conduction state that is higher than a capacitive reactance of said coupling capacitance.

2. A control component as set forth in claim 1 wherein said three-electrode device is a field-effect-transistor and said first, second and third electrodes are source, drain and gate, respectively.

3. A control component as set forth in claim 1 wherein said periodic signal is an RF signal.

4. A control component as set forth in claim 1 wherein said diode includes a Schottky barrier diode.

5. A control component as set forth in claim 1 wherein said diode means is monolithically formed in an integrated circuit with said resistance means.

6. A control component as set forth in claim 1 wherein said control component is constructed of discrete circuit components.

7. A control component as set forth in claim 1 wherein said control component is constructed of a hybrid of discrete and integrated circuit components.

8. A control component as set forth in claim 2 wherein said diode means has a maximum high current conductance state capacitance less than the gate capacitance of the transistor when the transistor is in the conducting state.

9. A control component as set forth in claim 2 wherein the control voltage includes a negative bias voltage that is selected to be less than but close to the avalanche breakdown voltage of the transistor during the non-conducting state of operation.

10. A control component as set forth in claim 1 wherein the control voltage signal includes an applied positive voltage chosen to be substantially equal to the maximum amplitude of said periodic signal coupled between said first and second electrodes of the device during the conducting state of operation.

11. A control component as set forth in claim 1 wherein the control voltage signal is a positive voltage on the order of 5.0 volts or more.

12. A control component as set forth in claim 1 wherein the control voltage signal is a positive voltage chosen to be less than the maximum amplitude of said periodic signal in the channel.

13. A control component as set forth in claim 1 wherein the control voltage includes a negative bias voltage chosen closer to the avalanche breakdown voltage than the pinch-off voltage of the diode.

14. A control component as set forth in claim 2 wherein the capacitive reactance of the diode is greater than the reactance of the transistor gate coupling capacitive reactance.

15. A control component as set forth in claim 2 wherein the reverse-bias current of the diode is in a range on the order of 50–250 microamps.

16. A control component as set forth in claim 1 wherein said resistance means has a resistance substantially greater than any resistance of said means for coupling.

17. A control component as set forth in claim 2, wherein the active area of said diode means is equal to or slightly less than the area of the gate electrode of the field-effect transistor.

18. A control component as set forth in claim 2, wherein the control voltage signal is set to the point where the required switching speed is attained.

19. A control component as claimed in claim 1 wherein the channel is coupled to the control electrode only through said coupling capacitance.

* * * * *